(12) United States Patent
Cheong et al.

(10) Patent No.: US 7,507,627 B2
(45) Date of Patent: Mar. 24, 2009

(54) METHOD OF FABRICATING NONVOLATILE MEMORY DEVICE

(75) Inventors: Seong-Hwee Cheong, Seoul (KR); Sang-Woo Lee, Seoul (KR); Jin-Ho Park, Gyeonggi-do (KR); Seung-Gil Yang, Gyeonggi-do (KR); Brad H. Lee, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 160 days.

(21) Appl. No.: 11/686,205

(22) Filed: Mar. 14, 2007

(65) Prior Publication Data

US 2008/0003711 A1    Jan. 3, 2008

(30) Foreign Application Priority Data

Jul. 3, 2006    (KR) ............... 10-2006-0062112

(51) Int. Cl.
*H01L 21/336*    (2006.01)

(52) U.S. Cl. .............. 438/257; 438/261; 438/264

(58) Field of Classification Search ........... 438/257, 438/260, 261, 263, 264, 216, 287; 257/314, 257/324, 410, 411
See application file for complete search history.

(56) References Cited

U.S. PATENT DOCUMENTS

| 7,005,697 | B2 |   | 2/2006  | Batra et al. |           |
|-----------|----|---|---------|--------------|-----------|
| 7,148,106 | B2 | * | 12/2006 | Joo et al.   | 438/257   |
| 7,208,793 | B2 | * | 4/2007  | Bhattacharyya| 257/314   |
| 7,393,745 | B2 | * | 7/2008  | Jeng         | 438/257   |
| 2005/0122775 | A1 | * | 6/2005 | Koyanagi et al. | 365/185.11 |
| 2008/0121976 | A1 | * | 5/2008 | Sandhu et al. | 257/321   |

FOREIGN PATENT DOCUMENTS

| KR | 10-2004-0056409 | 7/2004 |
| KR | 10-2005-0040534 | 5/2005 |
| KR | 10-2005-0039911 | 8/2005 |
| KR | 10-2006-0018532 | 3/2006 |
| KR | 10-2006-0070886 | 6/2006 |

OTHER PUBLICATIONS

English language abstract of Korean Publication No. 10-2005-0039911.
English language abstract of Korean Publication No. 10-2006-0018532.

* cited by examiner

*Primary Examiner*—Tuan H Nguyen
(74) *Attorney, Agent, or Firm*—Marger Johnson & McCollom, P.C.

(57) ABSTRACT

In one embodiment, a nonvolatile memory device can be fabricated by forming first metallic dots on a charge storage film using first source gas, forming substitution dots on the charge storage film on which the first metallic dots are formed and forming second metallic dots using a second source gas.

19 Claims, 5 Drawing Sheets

METHOD OF FABRICATING NONVOLATILE MEMORY DEVICE

CROSS-REFERENCE TO RELATED APPLICATIONS

This patent application claims benefit of foreign priority to Korean Patent Application No. 2006-62112 filed on Jul. 3, 2006, the entire contents of which are hereby incorporated by reference.

BACKGROUND

1. Field of Invention

Embodiments of the present invention relate generally to semiconductor memory devices and more particularly to a method of fabricating a nonvolatile memory device.

2. Discussion of the Related Art

Nonvolatile memory devices such as floating-gate flash memory devices can maintain data in the absence of any applied power. A unit cell of a floating-gate flash memory device must have a relatively thick tunnel oxide film to store charges (i.e., free electrons) in the floating gate. However, as the thickness of the tunnel oxide film increases, the operation voltage of the floating-gate flash memory device also increases. To solve this problem, a floating-gate flash memory device including a tunnel oxide film formed of a silicon-oxide-nitride-oxide-silicon (SONOS) layer has been proposed. A unit cell of such a SONOS memory device has a relatively thin tunnel oxide film because charges are stored in deeply potentialized traps isolated from each other. Thus, an operation voltage of the SONOS memory device is typically lower than that of a conventional floating-gate flash memory device. Well-known features of typical SONOS memory devices will be described in greater detail below.

FIG. 1 is a sectional view of a conventional SONOS memory cell.

As shown in FIG. 1, a conventional SONOS memory cell includes a tunnel oxide film 2, a silicon nitride film 3, a blocking oxide film 4, and a gate electrode 5 sequentially stacked on a semiconductor substrate 1 such that a multi-layer film including films of 2, 3 and 4 is interposed between the gate electrode 5 and the semiconductor substrate 1. Source/drain regions 6 are formed in the semiconductor substrate 1 at both sides of the gate electrode 5. The silicon nitride film 3 includes traps in deep energy potential. When a program voltage is applied to the gate electrode 5, charges tunnel through the tunnel oxide film 2 from a channel region and are then stored in traps of the silicon nitride film 3. When an erasing voltage is applied to the gate electrode 5, charges are released from the traps and pass through the tunnel oxide film 2 to be discharged into the channel region. In the SONOS memory cell, a first threshold voltage, corresponding to a state with charges stored in the traps, is different from a second threshold voltage, corresponding to a state without charges stored at the traps. Utilizing such a difference in threshold voltages, it is possible to detect that data stored in the SONOS memory cell is logically '1' or '0'.

The multi-layer film 2, 3 and 4 can include one or more defects 7 for various reasons. For example, the defect 7 may be formed while carrying out any of several steps for fabricating the SONOS memory device. The defect 7 may be a metallic impurity or another particle. The defect 7 may be an empty space having an amount of electric charges. Generally, the presence of such a defect 7 induces convergence of an electric field 8 within the multi-layer film 2, 3 and 4. Thus, when the gate electrode 5 is supplied with a program, erasing, or sensing voltage, an electric field 8 generated from the gate electrode 5 converges toward the defect 7 and can causes numerous problems during operation of the memory cell. For example, when a program or erasing voltage having a relatively high voltage level is applied to the gate electrode 5, the electric field 8 generated by the gate electrode 5 concentrates around the defect 7 and can damage portions of films 2, 3 and 4 adjacent thereto. Moreover, during a sensing operation for read data, charges may be stored in traps around the defect 7. The problems described above can deteriorate physical characteristics of the SONOS memory device.

SUMMARY

Embodiments of the present invention are adapted to solve the aforementioned problems and provide a method of fabricating a nonvolatile memory device capable in a manner that minimizes concentration of an electric field within the subsequently formed nonvolatile memory device.

Embodiments of the present invention are also adapted to provide a method of fabricating a nonvolatile memory device in a manner that minimizes the effects of defects between a gate electrode and a substrate of the subsequently formed nonvolatile memory device.

One exemplary embodiment can be characterized as a method of fabricating a nonvolatile memory device that includes: forming a tunnel insulation film on a substrate; forming a charge storage film on the tunnel insulation film; forming a plurality of first metallic dots on the charge storage film, the plurality of first metallic dots comprising at least one first metallic element; after forming the plurality of first metallic dots, forming a plurality of substitution dots on the charge storage film, the plurality of substitution dots comprising at least one substitution element; forming a plurality of second metallic dots on the charge storage film, the plurality of second metallic dots comprising at least one second metallic element, wherein forming the plurality of second metallic dots comprises substituting the at least one substitution element for the at least one second metallic element in a substitution reaction; forming a blocking insulation layer on the first and second plurality of metallic dots; and forming a gate electrode on the blocking insulation layer.

Another exemplary embodiment can be characterized as a method of fabricating a nonvolatile memory device that includes: forming an insulation film on a substrate; forming a plurality of metallic nanocrystals on the insulation film; forming an insulation layer on the plurality of metallic nanocrystals; and forming a gate electrode on the insulation layer. The plurality of metallic nanocrystals may be formed according to a metallic nanocrystal formation process that includes: forming a plurality of first dots on the insulation film at a first formation rate; and forming a plurality of second dots on the insulation film at a second formation rate greater than the first formation rate.

A further understanding of the nature and advantages of the present invention herein may be realized by reference to the remaining portions of the specification and the attached drawings.

BRIEF DESCRIPTION OF THE DRAWINGS

The accompanying figures are included to provide a further understanding of embodiments of the present invention, and are incorporated in and constitute a part of this specification. The drawings illustrate exemplary embodiments of the present invention and, together with the description, serve to explain principles of the present invention. In the figures.

DETAILED DESCRIPTION

Figure 1:
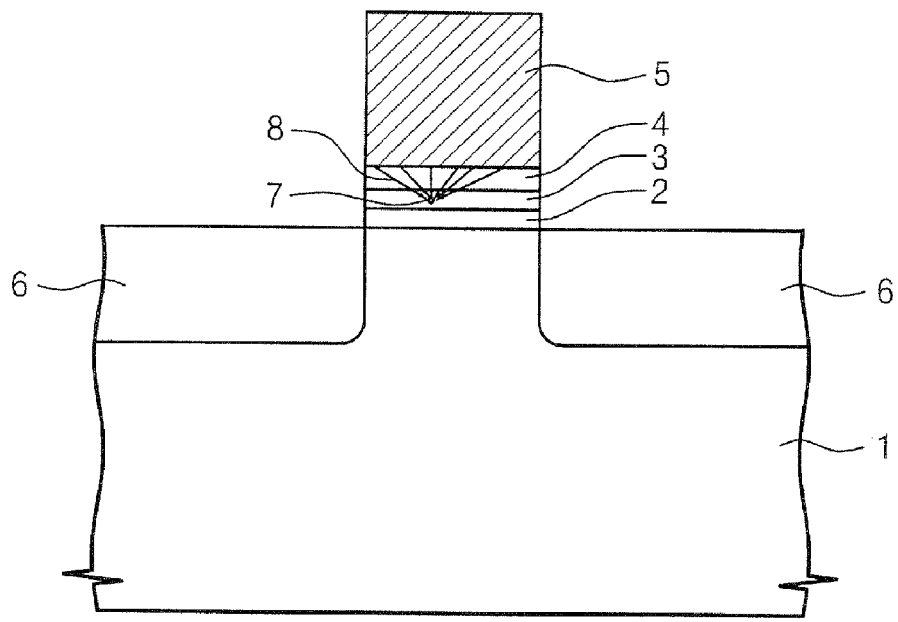
FIG. 1 is a sectional view of a conventional SONOS memory cell.

Exemplary embodiments of the present invention will be described below in more detail with reference to the accompanying drawings. Embodiments described herein may, however, be realized in different forms and should not be construed as limited to the embodiments set forth herein. Rather, these embodiments are provided so that this disclosure will be thorough and complete, and will fully convey the scope of the present invention to those skilled in the art.

In the figures, the dimensions of layers and regions are exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present. In the figures, like reference numerals refer to like elements throughout.

Figure 8:
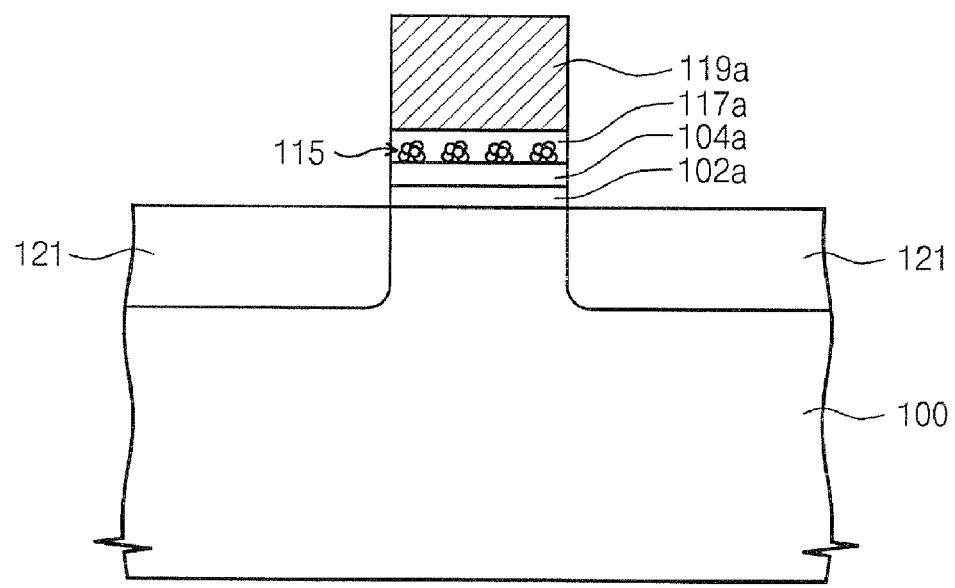
Figure 9:
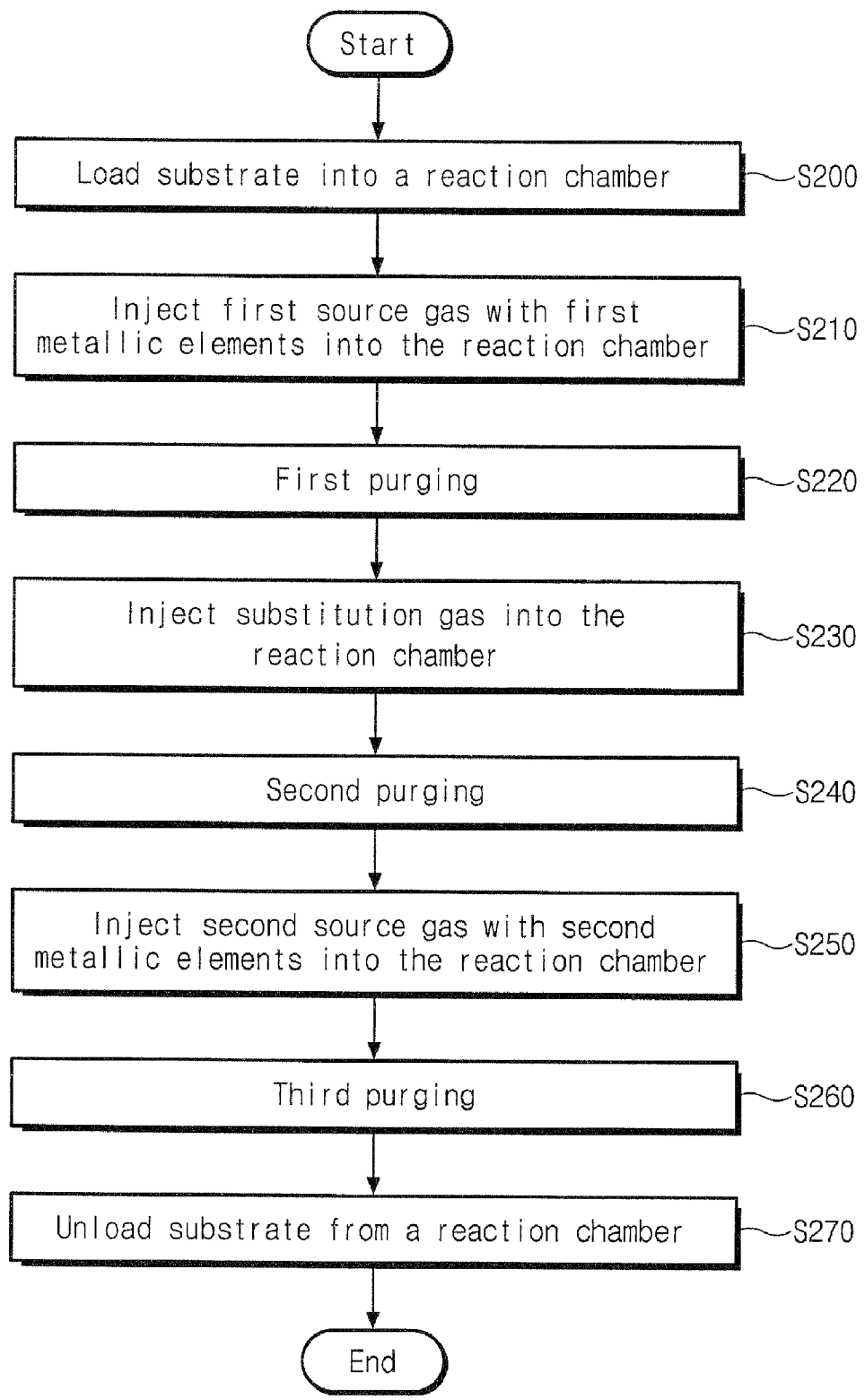
FIG. 9 is a flow chart showing an exemplary embodiment of a procedure of forming metallic nanocrystals.

FIGS. 2 through 8 are sectional views illustrating an exemplary embodiment of a method of fabricating a nonvolatile memory device and FIG. 9 is a flow chart showing an exemplary embodiment of a procedure of forming metallic nanocrystals.

Figure 2:
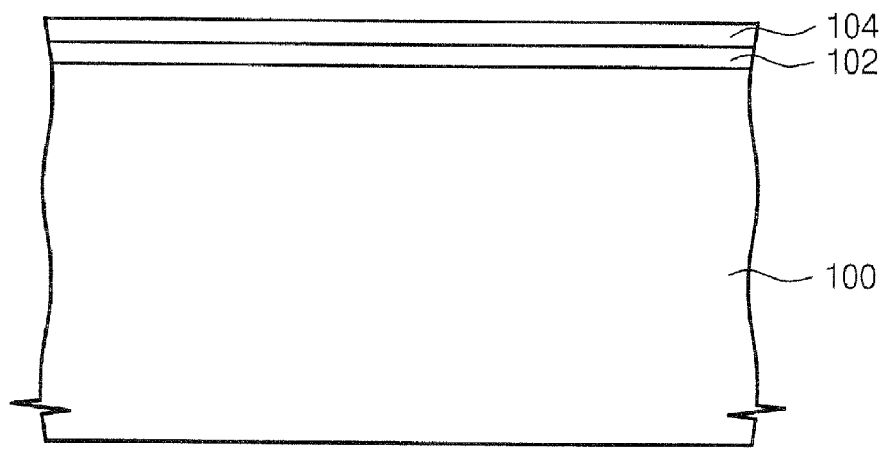
FIGS. 2 through 8 are sectional views illustrating an exemplary embodiment of a method of fabricating a nonvolatile memory device.

Referring to FIG. 2, a tunnel insulation film 102 and a charge storage film 104 (e.g., a trap storage film) are sequentially formed on a semiconductor substrate (hereinafter, abbreviated to as 'substrate') 100. The tunnel insulation film 102 may include an oxide material (e.g., a thermal oxide). The charge storage film 104 may include a material having deep level traps in which charges may be stored. In one embodiment, the charge storage film 104 may contain nitrogen. In another embodiment, the charge storage film 104 may include a material such as a nitride or an oxynitride. Prior to forming the tunnel insulation film 102, a device isolation region (not shown) may be formed to define active regions in the substrate 100. In one embodiment, the tunnel insulation film 102 and the charge storage film 104 may be sequentially deposited on the active region.

Next, metallic nanocrystals (e.g., such as those shown at 115 in FIG. 6) are formed on the charge storage film 104. In one embodiment, the metallic nanocrystals may be formed according to an atomic layer deposition (ALD) process. An exemplary method of forming metallic nanocrystals will now be described below in conjunction with FIGS. 3-6 and 9.

Figure 3:
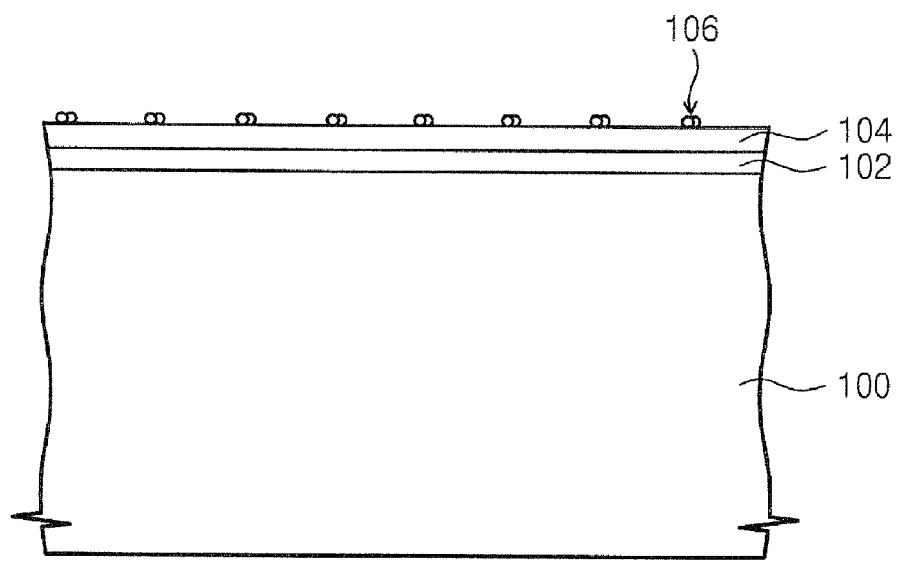

Referring to FIGS. 3 and 9, the substrate 100 having the charge storage film 104 formed thereon is loaded into a reaction chamber (S200). In one embodiment, the temperature in the reaction chamber may be about 150° C. to about 400° C. In another embodiment, the pressure in the reaction chamber may be in the range of about 1 mTorr to about 760 mTorr. The reaction chamber may include equipment suitable for carrying out ALD processes.

Thereafter, a first source gas is introduced into the reaction chamber (S210). In one embodiment, the first source gas includes one or more first metallic elements. The first metallic elements may include, for example, tungsten (W), titanium (Ti), tantalum (Ta), and the like. In one embodiment, the first source gas may include a gas such as tungsten fluoride ($WF_6$), titanium chloride ($TiCl_4$), tantalum chloride ($TaCl_5$), and the like, or combinations thereof. Upon injecting the first source gas, the first metallic elements in the first source gas are adsorbed onto surface of the charge storage film 104 while other components of the first source gas, (e.g., chlorine (Cl) or fluorine (F), etc.) are dissolved from the first metallic elements. As a result, first metallic dots 106 are formed on the charge storage film 104. The dissolved components of the first source gas may be evaporated therefrom. The first source gas may be injected into the reaction chamber between about 0.1 sec to about 5 sec.

After the first metallic dots 106 are formed, the reaction chamber is purged in a first purging process (S220) in which an inert gas such as argon (Ar) is injected into the reaction chamber. Unadsorbed remnants of the first source gas and the dissolved components are both discharged from the reaction chamber during the first purging process.

As described above, the first metallic dots 106 are formed by dissolving the first source gas in the reaction chamber. The first metallic dots 106 may contain one or more of the first metallic elements. The steps S210 and S220 for injecting the first source gas and first purging the reaction chamber may be repeated until the first metallic dots 106 are formed to a desired size and density on surface of the charge storage film 104.

Figure 4:
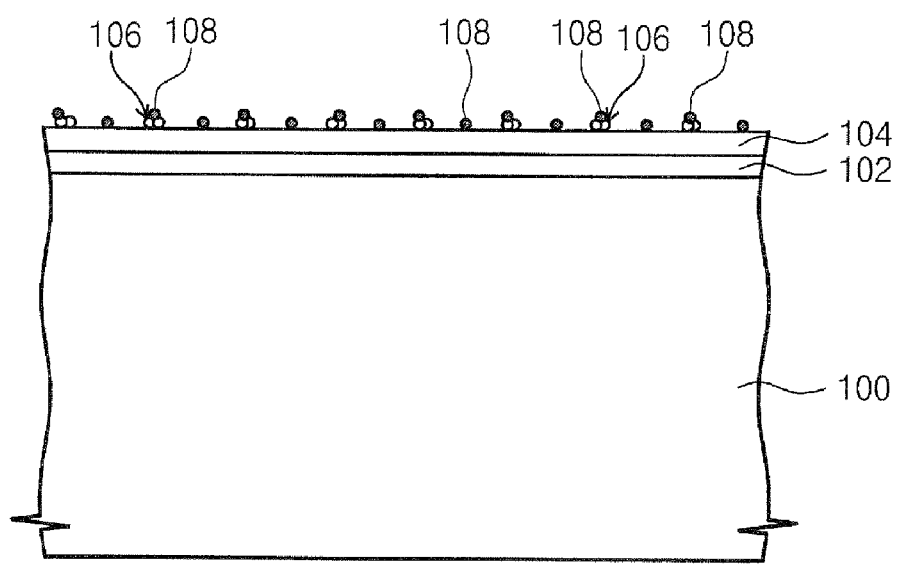

Referring to FIGS. 4 and 9, a substitution gas is injected into the reaction chamber after the first purging process (S220) has been completed (S230). In one embodiment, the substitution gas contains at least one substitution element. The substitution elements may, for example, include elements such as boron (B), silicon (Si), and the like, or combinations thereof. Accordingly, the substitution gas may include, for example, $B_2H_6$, $SiH_4$, $Si_2H_6$, $SiH_2Cl_2$, and the like, or combinations thereof. In one embodiment, the substitution gas may be injected into the reaction chamber for about 0.1 sec to about 5 sec. In another embodiment, the substitution gas may be injected at a flow rate of about 10 sccm to about 1000 sccm. While injecting the substitution gas into the chamber, pressure of the reaction chamber can be between about 1 mTorr to about 760 mTorr. Upon injecting the substitution gas into the reaction chamber (S230), substitution dots 108 may be formed on the charge storage film 104 after the first metallic dots 106 have been formed. Each substitution dot 108 may contain at least one substitution element.

As described above, the substitution dots 108 may include boron (B), silicon (Si), or the like, or combinations thereof, as substitution elements. Conventionally, such substitution elements diffuse into the charge storage film 104 and deteriorate physical characteristics of the charge storage film 104 and/or the tunnel insulation film 102. When such substitution elements are diffused into a channel region under the tunnel insulation film 102, the electrical characteristics of the channel region can become deteriorated. Moreover, such substitution elements, when present in the charge storage film 104 and/or the tunnel insulation film 102, can act as defects to cause concentration of an electric field thereon. However, because the substitution dots 108 shown in FIG. 4 are formed on the charge storage film 104 after the first metallic dots 106 are formed, the first metallic dots 106 adsorb at least a portion of the substitution dots 108. As a result, the metallic dots 106 help to minimize/prevent the extent to which substitution dots 108 diffuse into and through the charge storage film 104. Consequently, the aforementioned problems arising from diffusion of substitution elements into the charge storage film 104 and/or the tunnel insulation film 102 can be minimized.

After substitution dots 108 have been formed, the reaction chamber may be purged in a second purging process (S240). During the second purging process (S240), non-adsorbed substitution gas is discharged from the reaction chamber. Additionally, other components (e.g., hydrogen, chloride, etc.) of the substitution gas may be discharged out of the reaction chamber. The purging gas used in the second purging process (S240) may include an inert gas such as argon (Ar).

Figure 5:
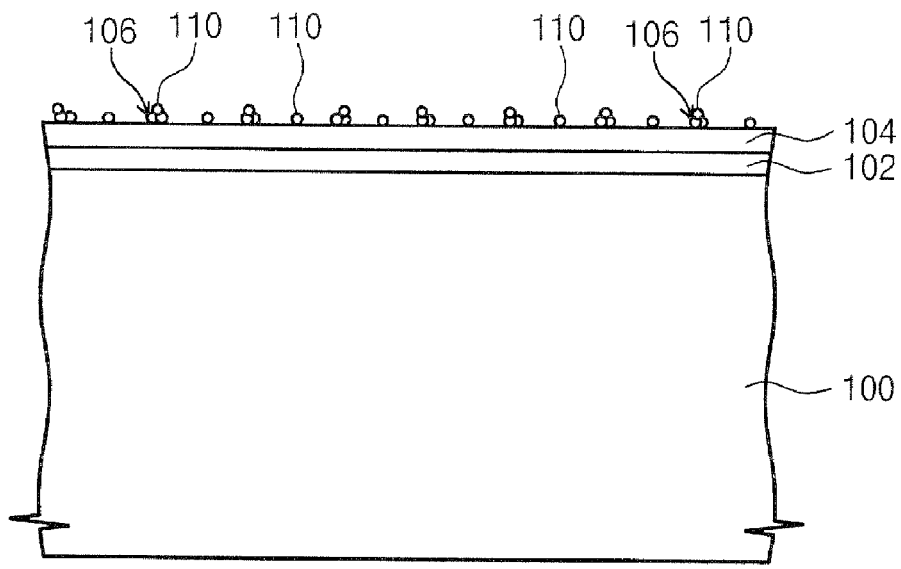
Figure 6:
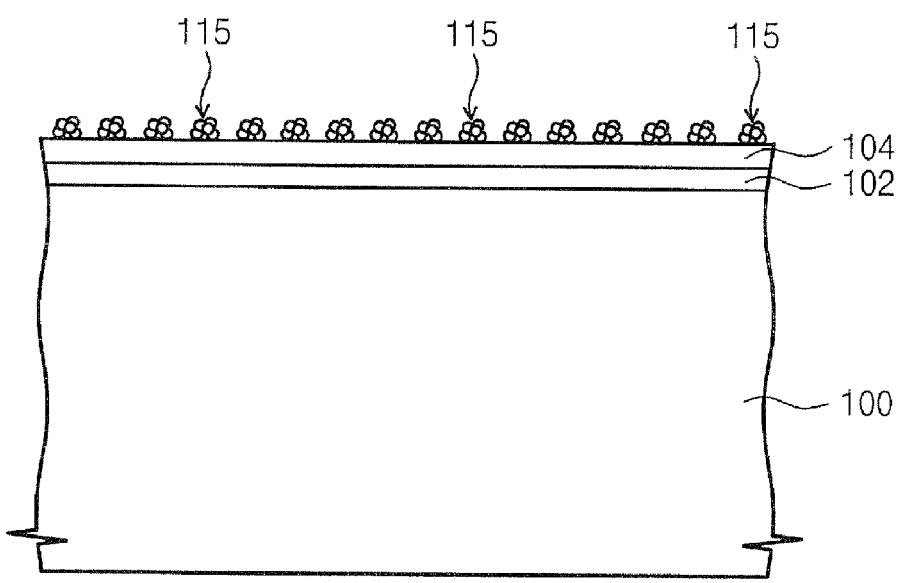
Figure 7:
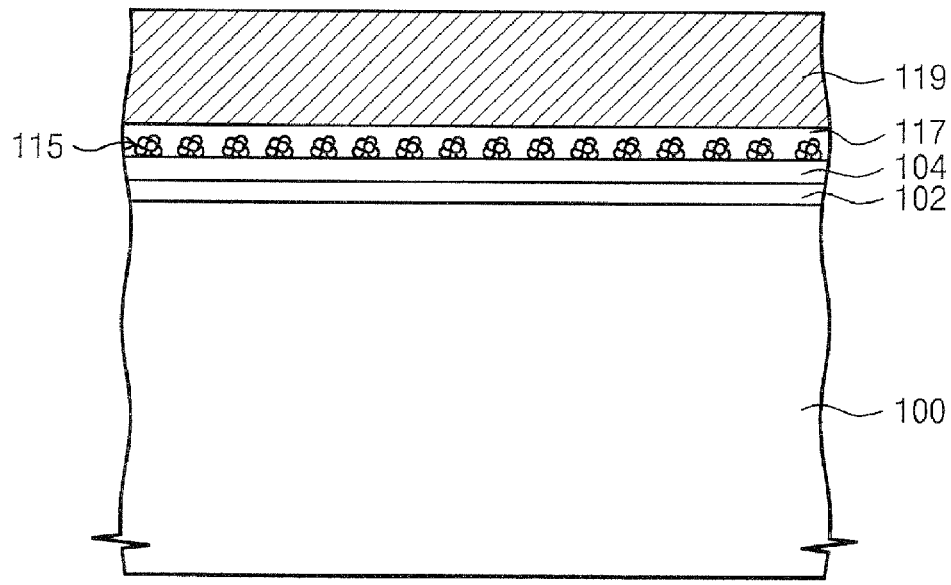

Referring next to FIGS. 5, 6 and 9, second source gas is injected into the reaction chamber (S250) to form second metallic dots 110. In one embodiment, the second source gas includes one or more second metallic elements. The second metallic elements include, for example, tungsten (W), titanium (Ti), tantalum (Ta), and the like. In another embodiment, the second source gas include a gas such as tungsten fluoride ($WF_6$), titanium chloride ($TiCl_4$), tantalum chloride ($TaCl_5$), and the like, or combinations thereof. The second source gas may be injected into the reaction chamber for about 0.1 sec to about 5 sec. Thus, the second metallic dots 110 may include one or more of the second metallic elements.

In one embodiment, the second metallic dots 110 may be formed according to a substitution reaction, wherein the substitution elements of the substitution dots 108 are replaced (i.e., substituted) by the second metallic elements of the second source gas. The substitution reaction may increase the formation rate of the second metallic dots 110. Thus, the formation rate of the second metallic dots 110 may be greater than the formation rate of the first metallic dots 106.

After the second metallic dots 110 are formed, the reaction chamber is purged in a third purging process (S260). This third purging process (S260) discharges reaction by-products of the substitution reaction from the reaction chamber. During the third purging process (S260), non-reacted remnants of the second source gas may also be discharged from the reaction chamber. The purging gas used in the third purging process (S260) may be an inert gas such as argon (Ar).

Upon forming the second metallic dots 110, metallic nanocrystals 115, such as those shown FIG. 6, are formed on the charge storage film 104. The metallic nanocrystals 115 can be distributed on the charge storage film 104 with a substantially uniform distribution density. In one embodiment, the substantially uniform distribution density can be about $1.0 \times 10^{12}/cm^2$ or about $1.8 \times 10^{12}/cm^2$. In one embodiment, metallic nanocrystals 115 may be isolated from each other.

In one embodiment, metallic nanocrystals 115 formed on the charge storage film 104 may include first and second metallic dots 106 and 110. For example, at least one metallic nanocrystal 115 may include both first and second metallic dots 106 and 110. In another example, at least one metallic nanocrystal 115 may include one or more first metallic dots 106 and no second metallic dots 110 while at least one metallic nanocrystal 115 includes one or more second metallic dots 110 and no first metallic dots 106.

In one embodiment, the first and second metallic elements may be the same metal such that metallic nanocrystals 115 include a single kind of metal. Otherwise, the first and second metallic elements may be different metals from each other. In other embodiments, the first and second source gases may be the same. Otherwise, the first and second source gases may be different from each other.

As described above, the charge storage film 104 contains nitrogen. Accordingly, if the first and second source gases contain nitrogen, a continuous film may be formed instead of metallic nanocrystals 115. Thus, in order to prevent the formation of a continuous film, it is desirable for the first and second source gases not to contain nitrogen.

In one embodiment, the size and density of the metallic nanocrystals 115 may be substantially matched with target values by repeating the steps of injecting the second source gas (S250) to form the second metallic dots 110 and performing the third purging process (S260) a plurality of times with a unit cycle thereof.

In one embodiment, the metallic nanocrystals 115 shown in FIG. 6 may be formed by repeating steps S250 and S260 a plurality of times. Also, the metallic nanocrystals 115 may be formed in the shape of the first and second metallic dots 106 and 110 shown FIG. 5.

After forming the metallic nanocrystals 115 and performing the third purging process (S260), the substrate 100 may be unloaded from the reaction chamber (S270). Then, referring to FIG. 7, a blocking insulation layer 117 may be formed all over the substrate 100 including the metallic nanocrystals 115. In one embodiment, the blocking insulation layer 117 may include a material such as an oxide. When the block insulation layer 117 includes an oxide, the block insulation layer 117 may be thicker than the tunnel insulation film 102. In another embodiment, the blocking insulation layer 117 may include a material having a dielectric constant higher than that of the tunnel insulation layer 102. For example, the blocking insulation layer 117 may include an insulating metal oxide such as hafnium oxide, aluminum oxide, or like, or combinations thereof. By providing a blocking insulation layer 117 formed of an insulating metal oxide, the thickness of the blocking insulation layer 117 may be reduced.

Next, a conductive gate film 119 is deposited on the blocking insulation film 117. The conductive gate film 119 may include a material such as doped polysilicon, metal (e.g., tungsten or molybdenum), conductive metal nitride (e.g., titanium nitride or tantalum nitride), metal silicide (tungsten silicide or cobalt silicide), or the like, or combinations thereof.

Referring to FIG. 8, the conductive gate film 119, the blocking insulation layer 117, the layer composed of the metallic nanocrystals 115, the charge storage film 104, and the tunnel insulation film 102 are sequentially patterned to form a tunnel insulation pattern 102a, a trap storage pattern 104a, a blocking insulation pattern 117a, and a gate electrode 119a, which are stacked in order. In the illustrated embodiment, metallic nanocrystals 115 may be disposed between the trap storage pattern 104a and the blocking insulation pattern 117a. The metallic nanocrystals 115 may be substantially uniformly distributed over the top surface of the trap storage pattern 104a.

Using the gate electrode 119a as a mask, dopant ions may be injected to form source/drain regions 121 in the substrate 100 adjacent to both sides of the gate electrode 119a.

According to the aforementioned method of fabricating the nonvolatile memory device, metallic nanocrystals 115 are formed between the trap storage pattern 104a and the blocking insulation pattern 117a. When an electric field is generated by the gate electrode 119a (e.g., upon applying an operation voltage to the gate electrode 119a), the metallic nanocrystals 115 act as intermediate electrodes and disperse the generated electric field. Because the metallic nanocrystals 115 are uniformly distributed on the trap storage pattern 104a, a substantially uniform electric field is applied to the trap storage pattern 104a, the tunnel insulation pattern 102a, and the channel region. Accordingly, even if defects such as those described above with respect to FIG. 1 are formed in the device shown in FIG. 8, the metallic nanocrystals 115 minimize the degree to which such defects concentrate an electric field generated by the gate electrode 119a.

According to the aforementioned method of forming the metallic nanocrystals 115, first metallic dots 106 are formed before the substitution dots 108 are formed. As a result, the first metallic dots 106 help to prevent substitution elements of the substitution dots 108 from diffusing into the charge storage film 104, the tunnel insulation film 102, and/or a substrate 100 (thereby minimizing the aforementioned problems arising from diffusion of substitution elements). In addition, the substitution elements help to enhance the rate with which the second metallic dots 110 are formed. As a result, it is possible to improve the formation rate of the metallic nanocrystals 115.

In view of the above, one exemplary embodiment can be characterized as a method of fabricating a nonvolatile memory device that includes sequentially forming a tunnel insulation film and a charge storage film; adsorbing first metallic dots on the charge storage film by means of first source gas containing first metallic elements; adsorbing substitution dots adsorbed on the charge storage film with the first metallic dots; forming second metallic dots using at least a substitution reaction between the second metallic elements of second source gas and substitution elements of the substitution dots, to form metallic nanocrystals on the charge storage film; forming a blocking insulation layer on the substrate; and forming a gate electrode on the blocking insulation layer.

In some embodiments, the first metallic dots block the substitution dots from being partially diffused into the charge storage film. The metallic nanocrystals may include the first and second metallic dots.

In some embodiments, the first metallic dots may be formed by loading the substrate with the charge storage film into a reaction chamber; injecting the first source gas into the reaction chamber to adsorb the first metallic elements of the first source gas on the charge storage film; and purging the reaction chamber. Forming the first metallic dots may be carried out by repeating a cycle of injecting the first source gas into the reaction chamber and first purging the reaction chamber in pluralities of times.

In some embodiments, the substitution dots may be formed by injecting substitution gas into the reaction chamber to adsorb the substitution dots on the charge storage film and purging the reaction chamber.

In some embodiments, the second metallic dots may be formed by injecting the second source gas into the reaction chamber at least to perform the substitution reaction and purging the reaction chamber. Forming the second metallic dots may be carried out by repeating a cycle of injecting the second source gas into the reaction chamber at least to perform the substitution reaction and third purging the reaction chamber in pluralities of times.

In some embodiments, the first and second metallic elements may be same material. The blocking insulation layer may be formed of an insulative material higher than the tunnel insulation film in dielectric constant.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of fabricating a nonvolatile memory device, comprising:
    forming a tunnel insulation film on a substrate;
    forming a charge storage film on the tunnel insulation film;
    forming a plurality of first metallic dots on the charge storage film, the plurality of first metallic dots comprising at least one first metallic element;
    forming a plurality of substitution dots on the charge storage film, the plurality of substitution dots comprising at least one substitution element;
    forming a plurality of second metallic dots on the charge storage film, the plurality of second metallic dots comprising at least one second metallic element, wherein forming the plurality of second metallic dots comprises substituting the at least one substitution element for the at least one second metallic element in a substitution reaction;
    forming a blocking insulation layer on the first and second plurality of metallic dots; and
    forming a gate electrode on the blocking insulation layer.

2. The method of claim 1, wherein forming the plurality of first metallic dots comprises:
    loading the substrate having the charge storage film formed thereon into a reaction chamber;
    injecting a first source gas into the reaction chamber, the first source gas comprising the at least one first metallic element;
    adsorbing the at least one first metallic element from the first source gas on the charge storage film; and
    performing a first purging process to purge the reaction chamber.

3. The method of claim 2, wherein forming the plurality of first metallic dots further comprises repeatedly injecting the first source gas into the reaction chamber, adsorbing the at least one first metallic element and performing the first purging process a plurality of times.

4. The method of claim 2, wherein forming the plurality of substitution dots comprises:
    injecting a substitution gas into the reaction chamber, the substitution gas comprising the at least one substitution element;
    adsorbing the at least one substitution element from the substitution gas on the charge storage film; and
    performing a second purging process to purge the reaction chamber.

5. The method of claim 4, wherein injecting the substitution gas into the reaction chamber comprises injecting the substitution gas into the reaction chamber for about 0.1 sec to about 5 sec.

6. The method of claim 4, wherein injecting substitution gas into the reaction chamber comprises injecting the substitution gas into the reaction chamber at a flow rate of about 10 sccm to about 1000 sccm.

7. The method of claim 2, wherein forming the plurality of second metalic dots comprises:
    injecting a second source gas into the reaction chamber, to the second source gas comprising the at least one second metallic element;
    performing the subtitution reaction; and
    performing a third purging process to purge the reaction chamber.

8. The method of claim 7, wherein forming the plurality of second metallic dots further comprises repeatedly injecting the second source gas into the reaction chamber, performing the substitution region and performing the third purging process a plurality of times.

9. The method of claim 7, wherein the second source gas into the reaction chamber chamber comprises injecting the second source gas into the reaction chamber for about 0.1 sec to about 5 sec.

10. The method of claim 2, further comprising maintaining a pressure inside the reaction chamber of about 1 mTorr to about 760 mTorr and maintaining a temperature inside the reaction chamber of about 150° C. to about 400° C.

11. The method of claim 2, wherein injecting the first source gas into the reaction chamber comprises injecting the first source gas into the reaction chamber for about 0.1 sec to about 5 sec.

12. The method of claim 1, wherein the first and second metallic elements comprise the same material.

13. The method of claim 1, wherein the blocking insulation layer comprises an insulative material having a dielectric constant higher than that of the tunnel insulation film.

14. A method of fabricating a nonvolatile memory device, comprising:
   forming an insulation film on a substrate;
   forming a plurality of metallic nanocrystals on the insulation film;
   forming an insulation layer on the plurality of metallic nanocrystals; and
   forming a gate electrode on the insulation layer,
   wherein the plurality of metallic nanocrystals are formed according to a metallic nanocrystal formation process comprising:
      forming a plurality of first dots on the insulation film at a first formation rate; and
      forming a plurality of second dots on the insulation film at a second formation rate greater than the first formation rate.

15. The method of claim 14, wherein the metallic nanocrystal formation process further comprises:
   after forming the plurality of first dots, forming a plurality of substitution dots on the insulation film, the plurality of first dots preventing diffusion of at least a portion of the plurality substitution dots into at least a portion of the insulation film; and
   substituting the plurality of substitution dots for the plurality of second dots in a substitution reaction.

16. The method of claim 14, wherein the plurality of metallic nanocrystals are isolated from each other.

17. The method of claim 14, wherein the first and second dots comprise at least one metallic element.

18. The method of claim 14, wherein the first and second dots comprise the same metallic element.

19. The method of claim 14, wherein at least one metallic nanocrystal comprises at least one first dot and at least one second dot.

* * * * *